United States Patent
Wang et al.

(10) Patent No.: US 10,169,521 B2
(45) Date of Patent: Jan. 1, 2019

(54) METHOD FOR FORMING CONTACT PLUG LAYOUT

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Ying-Chiao Wang, Changhua County (TW); Yu-Cheng Tung, Kaohsiung (TW); Chien-Ting Ho, Taichung (TW); Li-Wei Feng, Kaohsiung (TW); Emily SH Huang, Tainan (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 44 days.

(21) Appl. No.: 15/479,271

(22) Filed: Apr. 4, 2017

(65) Prior Publication Data
US 2018/0260510 A1     Sep. 13, 2018

(30) Foreign Application Priority Data

Mar. 9, 2017    (CN) .......................... 2017 1 0137695

(51) Int. Cl.
| G06F 17/00 | (2006.01) |
|---|---|
| G06F 17/50 | (2006.01) |
| H01L 27/02 | (2006.01) |
| H01L 27/108 | (2006.01) |

(52) U.S. Cl.
CPC ...... *G06F 17/5077* (2013.01); *H01L 27/0207* (2013.01); *H01L 27/10823* (2013.01)

(58) Field of Classification Search
USPC ........................................................ 716/129
See application file for complete search history.

(56) References Cited

U.S. PATENT DOCUMENTS

| 9,230,612 | B2 | 1/2016 | Park | |
|---|---|---|---|---|
| 9,431,324 | B2 | 8/2016 | Shin | |
| 2005/0173750 | A1* | 8/2005 | Park | H01L 27/10876 257/304 |
| 2007/0132040 | A1* | 6/2007 | Yokoyama | H01L 29/4983 257/408 |
| 2008/0048333 | A1* | 2/2008 | Seo | H01L 21/743 257/773 |
| 2008/0197393 | A1* | 8/2008 | Kim | H01L 27/0207 257/298 |

(Continued)

*Primary Examiner* — Mohammed Alam
(74) *Attorney, Agent, or Firm* — Winston Hsu (57) ABSTRACT

A method for forming a contact plug layout include following steps. (a) Receiving a plurality of active region patterns and a plurality of buried gate patterns that are parallel with each other, and each active region pattern overlaps two buried gate patterns to form two overlapping regions and one contact plug region in between the two overlapping regions in each active region pattern; and (b) forming a contact plug pattern in each contact plug region, the contact plug pattern respectively includes a parallelogram, and an included angle of the parallelogram is not equal to 90°. The contact plug pattern in each active region pattern partially overlaps the two buried gate pattern, respectively. The step (a) to the step (b) are implemented using a computer.

19 Claims, 10 Drawing Sheets

(56) References Cited

U.S. PATENT DOCUMENTS

| | | | |
|---|---|---|---|
| 2010/0140676 A1* | 6/2010 | Yeom | H01L 27/10876 257/296 |
| 2011/0223731 A1* | 9/2011 | Chung | H01L 27/0207 438/270 |
| 2011/0260286 A1* | 10/2011 | Lee | H01L 21/76229 257/508 |
| 2012/0228702 A1* | 9/2012 | Wu | H01L 29/4236 257/330 |

* cited by examiner

METHOD FOR FORMING CONTACT PLUG LAYOUT

BACKGROUND OF THE INVENTION

1. Field of the Invention

The present invention relates to a method for forming a contact plug layout, and more particularly, to a method for forming a bit line contact plug layout for a semiconductor memory device.

2. Description of the Prior Art

Dynamic random access memory (hereinafter abbreviated as DRAM) is a volatile memory that commonly used as system memory. A memory cell array of DRAM has a configuration in which memory cells, each including an access metal-oxide-semiconductor field effect transistor (hereinafter abbreviated as MOSFET) and a storage capacitor, are arranged in array-like manner, i.e. in row and column directions.

The storage capacitors are formed either by etching trenches in the substrate in each of the cell areas, commonly referred to as trench capacitors, or are formed over the access FETs in the cell areas by depositing and patterning conducting layers over the access transistors, and are commonly referred to as stacked capacitors. The capacitors make electrical contact to one of the two source/drain areas (node contact) of each FET, while bit lines make electrical contact to the other source/drain area of each FET. It is becoming increasingly difficult to fabricate more memory cells on a DRAM device while limiting the overall DRAM device area to a practical size without decreasing the cell area. Further, as the cell area decreases, the available area for the storage capacitor in each cell also decreases. This makes it difficult to maintain sufficient capacitance to provide the necessary signal-to-noise ratio. Also, the refresh cycle time necessary to maintain sufficient charge on these capacitors also decreases, resulting in DRAM devices with reduced performance (speed). Therefore, one method in the semiconductor industry of overcoming the above problems is to form DRAM devices having stacked capacitors. These types of capacitors extend vertically upward over the MOS transistors. The two basic types of stacked capacitor DRAM cells of the prior art are the capacitor over bit line (hereinafter abbreviated as COB) and capacitor under bit line (CUB).

Figure 1:
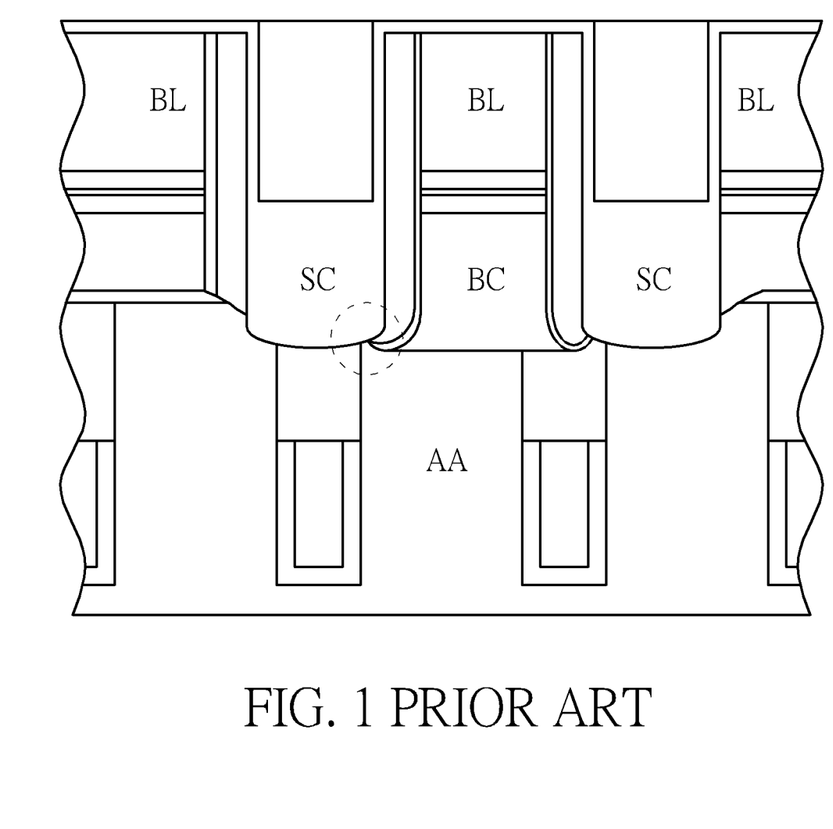
FIG. 1 is a schematic cross-sectional view of a conventional DRAM.

Please refer to FIG. 1, which is a schematic cross-sectional view of a conventional DRAM. As shown in FIG. 1, electrical connection between the MOS FET and the capacitor is provided by a storage node contact plug SC, and the electrical connection between the MOS FET and the bit line BL is provided by a bit line contact plug BC. However, as memory cells of DRAM become more integrated and miniaturized, it is found that the storage node contact plug SC may contact and connect to the bit line contact plug BC by the active region AA in the COB approach. Consequently, short circuit is formed, as depicted by the dotted circle shown in FIG. 1. The SC-BC short issue causes serious problem to the process and the products. Therefore, a method to solve this issue is in need.

SUMMARY OF THE INVENTION

According to an aspect of the present invention, a method for forming a contact plug layout is provided. The method includes following steps: (a) receiving a plurality of active region patterns and a plurality of buried gate patterns that are parallel with each other, each active region pattern overlapping two buried gate patterns to form two overlapping regions and one contact plug region in between the two overlapping regions in each active region pattern; and (b) forming a contact plug pattern on each contact plug region, the contact plug patterns respectively including a parallelogram, and an included angle of the parallelograms is not equal to 90°. The contact plug pattern partially overlaps the two buried gate patterns in each active region pattern, respectively. Step (a)-(b) are implemented using a computer.

According to an aspect of the present invention, another method for forming a contact plug layout is provided. The method includes following steps: (a) receiving a plurality of active region patterns and a plurality of buried gate patterns, the buried gate patterns being extended along a first direction and arranged along a second direction perpendicular to the first direction, each active region pattern overlapping two buried gate patterns to form two overlapping regions and one contact plug region in between the two overlapping regions in each active region pattern; (b) forming a first rectangle pattern respectively on the contact plug regions, the first rectangle patterns respectively including a pair of first sides and a pair of second sides, and the first sides and the second sides being perpendicular to each other; (c) extending the first sides or the second sides of the first rectangle patterns to form second rectangle patterns, respectively; and (d) reshaping the second rectangle patterns to form a plurality of contact plug patterns, the contact plug patterns respectively including a parallelogram, and an internal angle of the parallelograms being not equal to 90°, the contact plug patterns respectively including a pair of third sides and a pair of fourth sides, the third sides being parallel with the first direction, and the fourth sides being parallel with the active region patterns. Step (a)-(d) are implemented using a computer.

According to an aspect of the present invention, still another method for forming a contact plug layout is provided. The method includes following steps: (a) receiving a plurality of active region patterns and a plurality of buried gate patterns, the buried gate patterns being extended along a first direction and arranged along a second direction perpendicular to the first direction, each active region pattern overlapping two buried gate patterns to form two overlapping regions and one contact plug region in between the two overlapping regions in each active region pattern; (b) forming a rectangle pattern respectively on the contact plug regions, the rectangle patterns respectively including a pair of first sides and a pair of second sides, and the first sides and the second sides being perpendicular to each other; (c) reshaping the rectangle patterns to form a plurality of rhombus patterns, an internal angle of the rhombus patterns being not equal to 90°, the rhombus patterns respectively including a pair of third sides and a pair of fourth sides, the third sides being parallel with the first direction, and the fourth sides being parallel with the active region patterns; and (d) extending the fourth sides of the rhombus patterns to form a plurality of contact plug patterns, the contact plug patterns respectively including a parallelogram, and an internal angle of the parallelograms being not equal to 90°. Step (a)-(d) are implemented using a computer.

According to the methods for forming the contact plug layout provided by the present invention, the contact plug patterns including the shape the same with the contact plug regions and the size larger than the contact plug regions are formed. Therefore it is ensured that the following formed contact openings are larger than the active regions underneath. And thus the isolation structures used to electrically isolate the active regions are exposed at bottoms of the contact openings. Therefore, the bit line contact plugs and the storage node contact plugs that are formed thereafter can be electrically isolated by the isolation structures. In other words, process yield and product performance are both improved by the methods for forming the contact plug layout provided by the present invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-6 are schematic drawings illustrating the method for forming the contact plug layout pattern provided by the first preferred embodiment, wherein

FIGS. 3-4 and 9-10 are schematic drawings illustrating the method for forming the contact plug layout pattern provided by the second preferred embodiment, wherein

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 2:
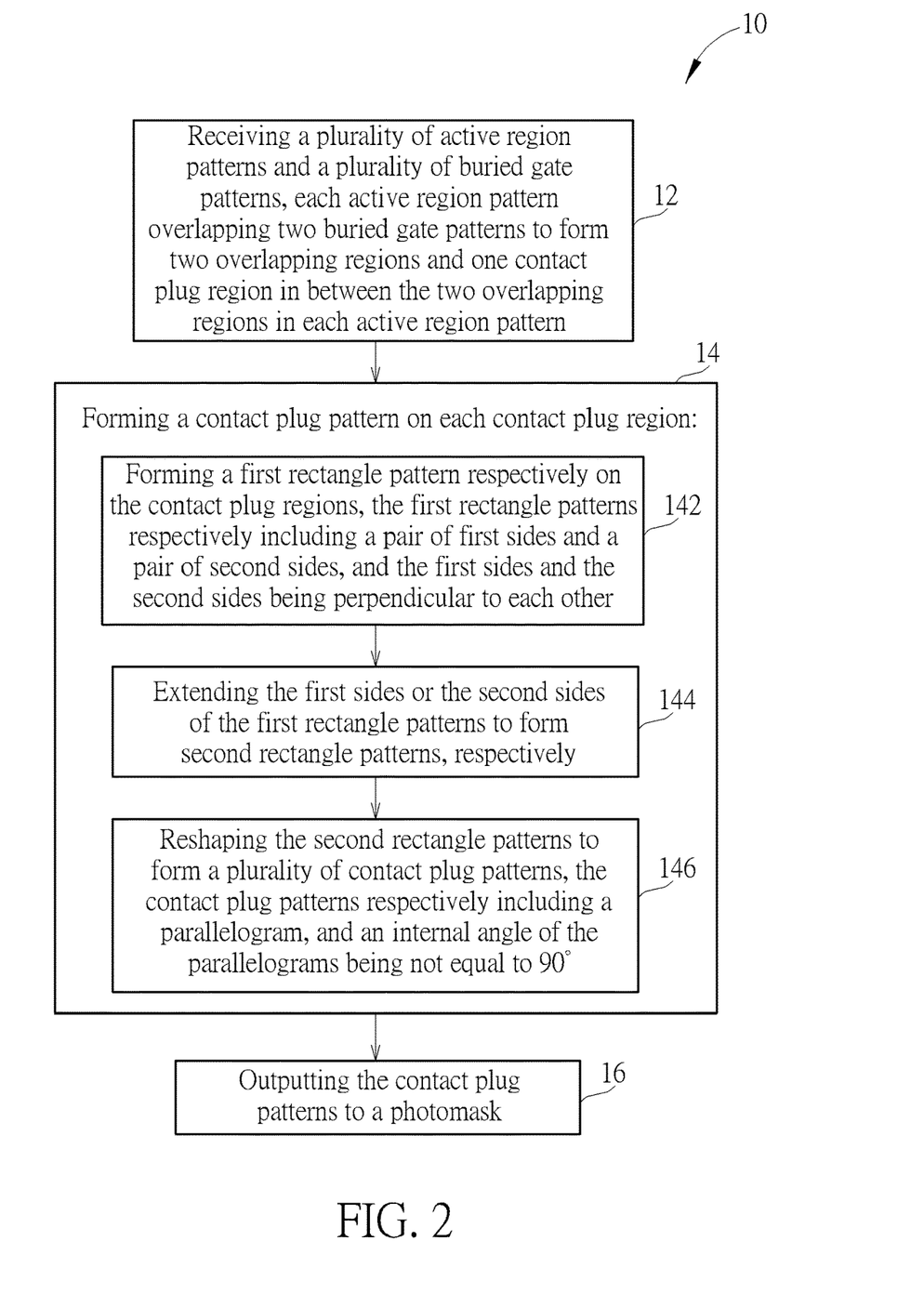
FIG. 2 is a flow chart of a method for forming a contact plug layout provided by a first preferred embodiment of the present invention.
Figure 3:
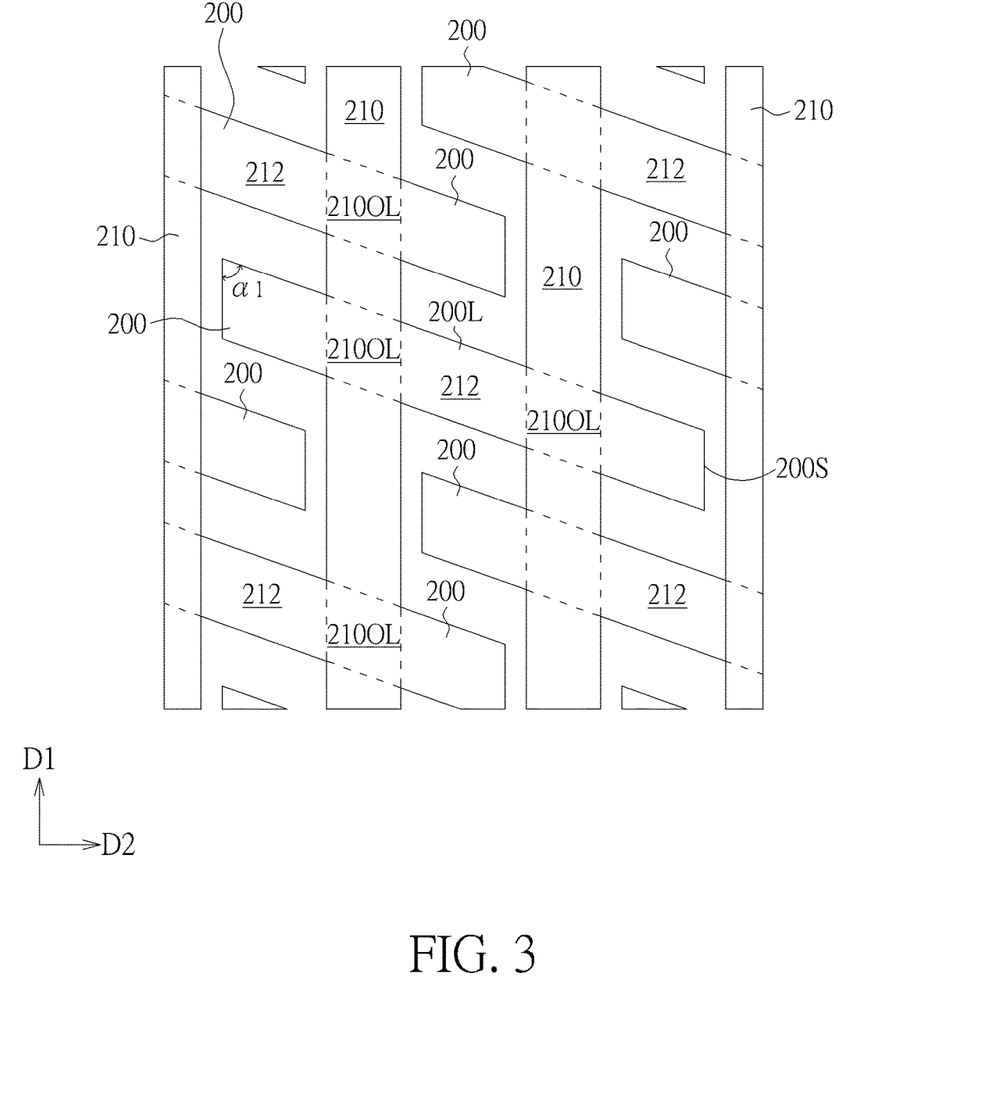

Please refer to FIGS. 2-6, FIG. 2 is a flow chart of a method for forming a contact plug layout provided by a first preferred embodiment of the present invention, and FIGS. 3-6 are schematic drawings illustrating the method for forming the contact plug layout pattern provided by the first preferred embodiment. As shown in FIG. 2, the method for forming the contact plug layout pattern 10 includes:

STEP 12: Receiving a plurality of active region patterns and a plurality of buried gate patterns, each active region pattern overlapping two buried gate patterns to form two overlapping regions and one contact plug region in between the two overlapping regions in each active region pattern Please refer to FIG. 3 together with FIG. 2. As shown in FIG. 3, a plurality of active region patterns 200 and a plurality of buried gate patterns 210 are received. And the buried gate patterns 210 are parallel with each other. According to the preferred embodiment, the active region patterns 200 can be formed in a memory cell region of a DRAM device for accommodating memory cells therein. As shown in FIG. 3, the active region patterns 200 respectively include an island shape and the islanding active region patterns 200 are physically spaced apart from each other. In some embodiments of the present invention, the active region patterns 200 can be formed in a substrate by performing a patterning process. Consequently, a plurality of active regions spaced apart from each other by isolation structures are obtained. The buried gate patterns 210 can be the gates of MOS FET used to form the memory cell of the DRAM device. It should be easily realized by those skilled in the art that the buried gate patterns 210 can be formed by performing a patterning process. Consequently, a plurality of recesses are formed in the substrate. Thereafter, gate dielectric layer and gate conductive layer are sequentially formed in the recesses and followed by forming an insulating layer to seal the recesses. Thus, a plurality of buried gates for the DRAM memory cells are obtained.

Please still refer to FIG. 3. According to the preferred embodiment, the active region patterns 200 respectively include a pair of long sides 200L and a pair of short sides 200S. As shown in FIG. 3, the short sides 200S of the active region patterns 200 are parallel with a first direction D1. The short sides 200S of the active region patterns 200 are also parallel with the buried gate patterns 210. The long sides 200L of the active region patterns 200 and the first direction D1 include an included angle $\alpha_1$. That is, the long sides 200L of the active region patterns 200 and the buried gate patterns 210 also included the included angle $\alpha_1$. And the included angle $\alpha_1$ is not equal to 90°. Furthermore, an internal angle of the active region patterns 200 is equal to the included angle $\alpha_1$. It is concluded that the active region patterns 200 respectively include a parallelogram, and an internal angle of the parallelograms is not equal to 90°. The buried gate patterns 210 are extended along the first direction D1 and arranged along a second direction D2, as shown in FIG. 3. And the first direction D1 and the second direction D2 are perpendicular to each other.

Please still refer to FIG. 3. In the preferred embodiment, each active region pattern 200 overlaps two buried gate patterns 210 that are adjacent to each other. Therefore, two overlapping regions 2100L are formed by the two buried gate patterns 210 and the active region pattern 200 as shown in FIG. 3. More important, a region in between the two overlapping regions 2100L is defined as a contact plug region 212 where a contact plug is to be formed. As shown in FIG. 3, any contact plug region 212 is immediately adjacent to two overlapping regions 2100L.

Please refer to FIG. 2. The method for forming the contact plug layout 10 provided by the preferred embodiment of the present invention includes:

STEP 14: Forming a contact plug pattern on each contact plug region

Figure 4:
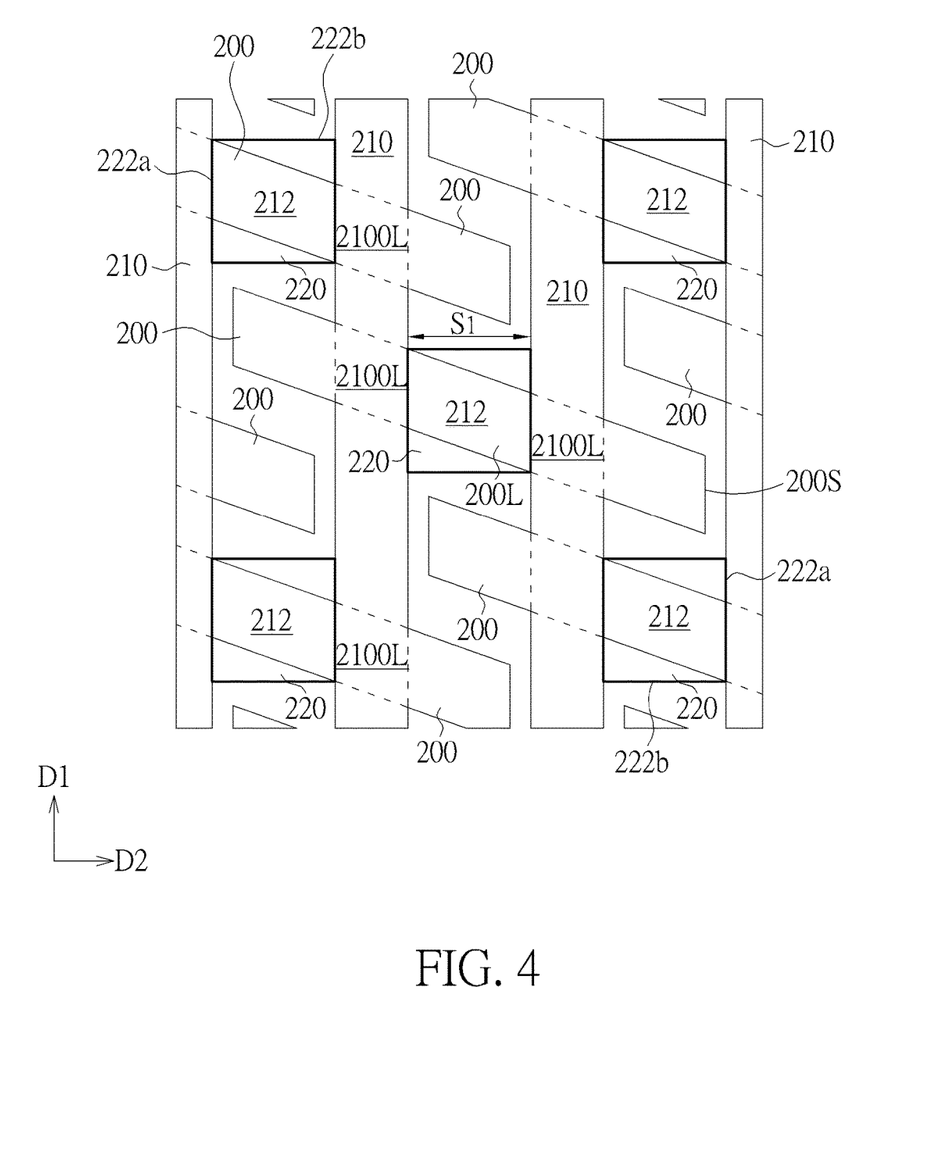
FIG. 4 is a schematic drawing in a step subsequent to FIG. 3.

It is noteworthy that STEP 14 further includes following steps in accordance with the preferred embodiment:

STEP 142: Forming a first rectangle pattern respectively on the contact plug regions, the first rectangle patterns respectively including a pair of first sides and a pair of second sides, and the first sides and the second sides being perpendicular to each other Please refer to FIG. 4 together with FIG. 2. According to STEP 142, an original contact plug pattern is formed on each contact plug region 212, and the original contact plug pattern includes a first rectangle pattern 220, such as a square pattern, but not limited to this. As shown in FIG. 4, the first rectangle patterns 220 respectively include a pair of first sides 222a and a pair of second sides 222b. A length of the first sides 222a and a length of the second sides 222b are equal. The first sides 222a are parallel with the first direction D1 and the second sides 222b are parallel with the second direction D2. In other words, the first sides 222a of the first rectangle patterns 220 are parallel with the buried gate patterns 210 and the second sides 222b are perpendicular to the buried gate patterns 212. It is noteworthy that the first rectangle patterns 220 overlap the contact plug regions 212 of the active region patterns 210, respectively. The length of the first sides 222a of the first rectangle patterns 220 is larger than a length of the first short sides 200S of the active region patterns 200, and the length of the second sides 222b of the first rectangle patterns 220 is equal to a width of the contact plug regions 212. That is, the length of the second sides 222b is equal to a distance $S_1$ between the two overlapping regions 2100L in each active region pattern 200. As shown in FIG. 4, the first rectangle pattern 220 overlaps the entire contact plug region 212 in each active region pattern 200.

Figure 5:
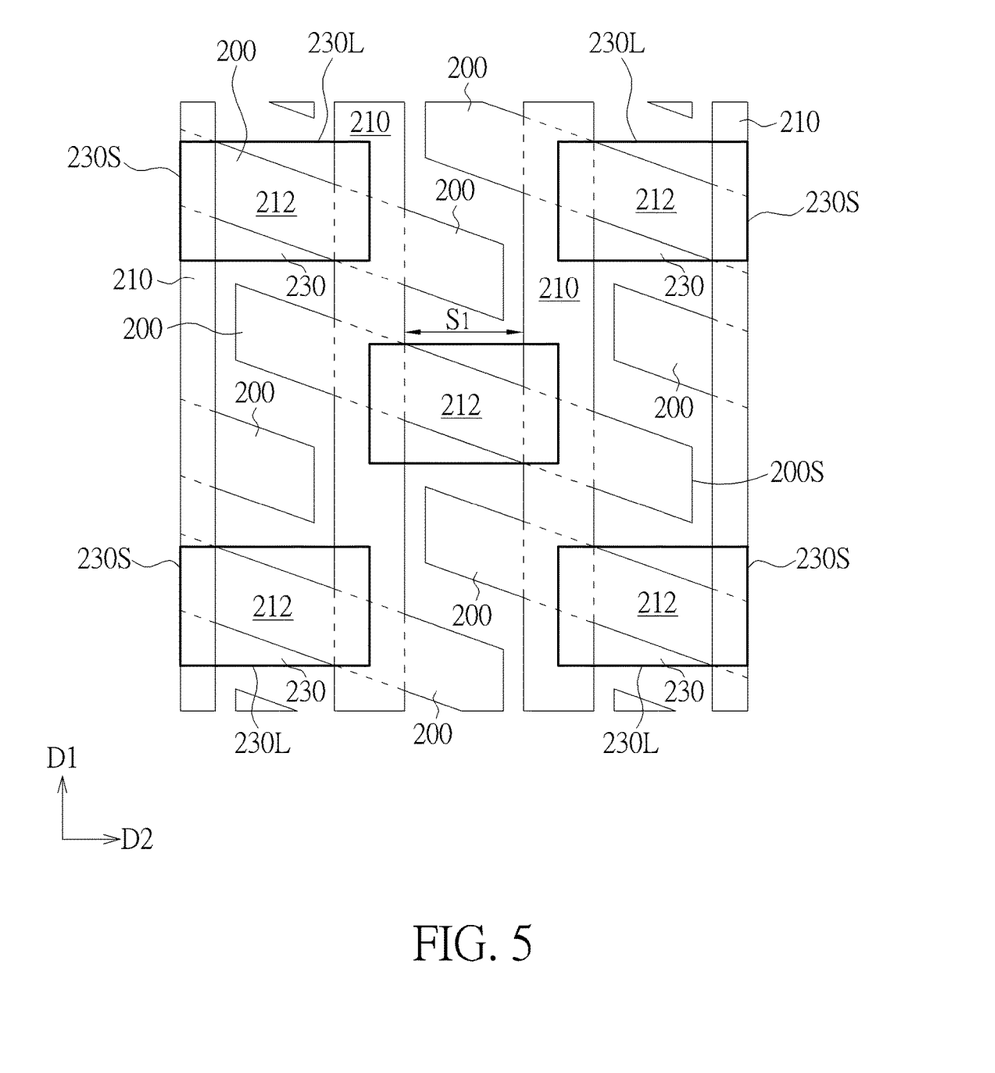
FIG. 5 is a schematic drawing in a step subsequent to FIG. 4.

Please refer to FIG. 5 together with FIG. 2. STEP 14 provided by the preferred embodiment further includes:

STEP 144: Extending the first sides or the second sides of the first rectangle patterns to form second rectangle patterns, respectively As shown in FIG. 5, according to STEP 144, the second sides 222b of the first rectangle patterns 220 are extended to form second rectangle patterns 230, respectively. The second rectangle patterns 230 respectively include a pair of long sides 230L and a pair of short sides 230S, and an included angle of the long sides 230L and the short sides 230S is equal to 90°. The long sides 230L of the second rectangle patterns 230 are parallel with the second direction D2 while the short sides 230S are parallel with the first direction D1. In other words, the short sides 230S of the second rectangle patterns 230 are parallel with the buried gate patterns 210, and the long sides 230L are perpendicular to the buried gate patterns 210. It is noteworthy that the second rectangle patterns 230 overlap the contact plug regions 212 in the active region patterns 210, respectively. A length of the long sides 230L of the second rectangle patterns 230 is larger than the width of the contact plug regions 212. That is, the length of the long sides 230L is larger than the distance $S_1$ between the two the overlapping regions 2100L in each active region pattern 200. As shown in FIG. 5, the two buried gate patterns 210 in each active region pattern 200 are partially overlapped by the second rectangle patterns 230, respectively.

Figure 6:
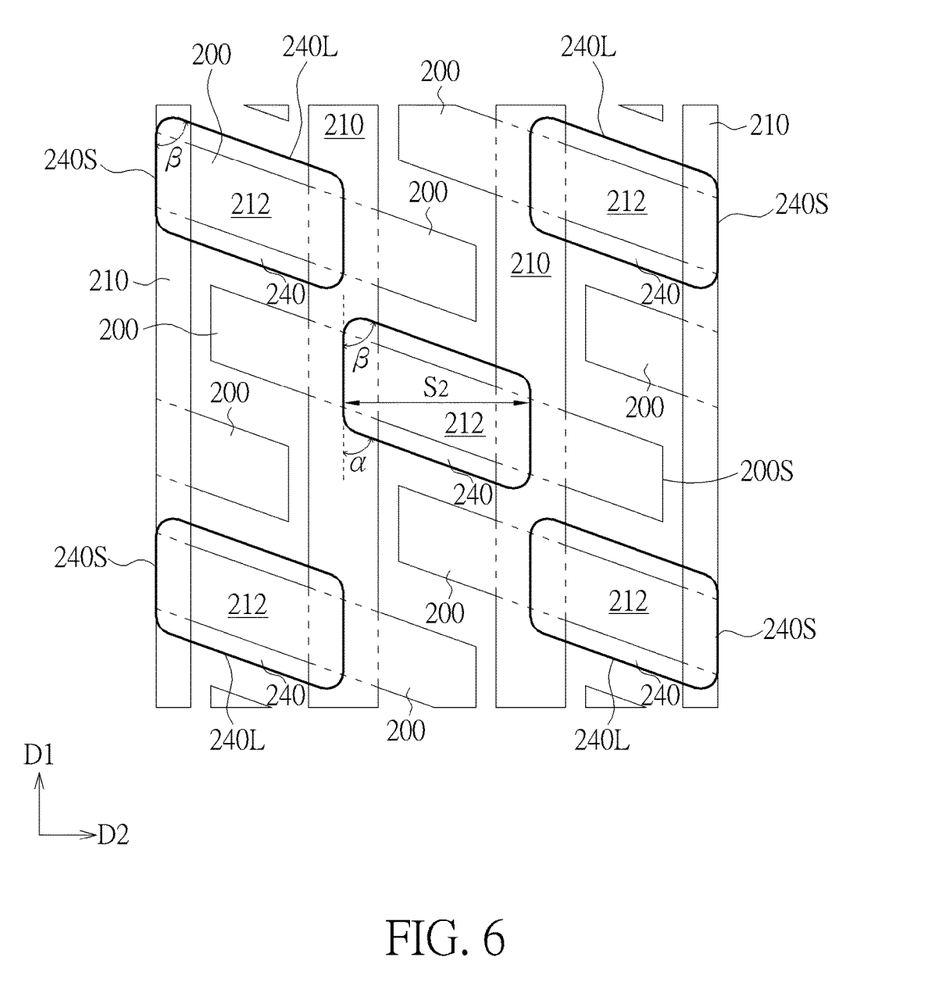
FIG. 6 is a schematic drawing in a step subsequent to FIG. 5.

Please refer to FIG. 6 together with FIG. 2. STEP 14 provided by the preferred embodiment further includes:

STEP 146: Reshaping the second rectangle patterns to form a plurality of contact plug patterns, the contact plug patterns respectively including a parallelogram, and an internal angle of the parallelograms being not equal to 90°

Please refer to FIG. 6. According to STEP 146 of the preferred embodiment, the second rectangle patterns 230 are reshaped to form a plurality of contact plug patterns 240. In details, the second rectangle patterns 230 are twisted thus a parallelogram is respectively formed, and an internal angle $\beta$ of the parallelograms is not equal to 90°. In other words, the preferred embodiment is to reshape the original contact plug patterns, which are squares, to form the reshaped contact plug patterns 240, which are parallelograms with the internal angle $\beta$ not equal to 90°. As shown in FIG. 6, the contact plug patterns 240 respectively include a pair of long sides 240L and a pair of short sides 240S. Additionally, the contact plug patterns 240 can be rotated during or after reshaping. Consequently, the short sides 240S of the contact plug patterns 240 are parallel with the first direction D1. That is, the short sides 240S are parallel with the buried gate patterns 210. Furthermore, a length of the short sides 240S of the contact plug patterns 240 is larger than the length of the short sides 200S of the active region patterns 200. The long sides 240L of the contact plug patterns 240 and the first direction D1 include an included angle $\alpha_2$, and the included angle $\alpha_2$ is the same with or complementary to the included angle $\alpha_1$ of the first direction D1 and the long sides 200L of the active region patterns 200. As shown in FIG. 6, the long sides 240L of the contact plug patterns 240 are parallel with the long sides 200L of the active region patterns 200. It is noteworthy that after reshaping the second rectangle patterns 230 to form the contact plug patterns 240 that including the parallelograms, the contact plug patterns 240 overlap the contact plug regions 212 in the active region patterns 210. A distance $S_2$ between the short sides 240S of each contact plug pattern 240 is larger the width of the contact plug region 212. Accordingly, the two buried gate patterns 210 in each active region pattern 200 are partially overlapped by the contact plug pattern 240, respectively, as shown in FIG. 6.

Furthermore, a step of extending the short sides 240S of the contact plug patterns 240 is selectively performed after STEP 146. Such that the length of the short sides 240S of the contact plug patterns 240 is ensured to be larger than the length of the short sides 200S of the active region patterns 200. Accordingly, the contact plug region 212 in each active region pattern 200 is entirely overlapped by the contact plug pattern 240, which includes the shape the same with the contact plug region 212 and the size larger than the contact plug region 212, as shown in FIG. 6.

It is noteworthy that STEP 12 to STEP 14 can be implemented using a computer. And the method for forming the contact plug layout provided by the preferred embodiment further includes following step:

STEP 16: Outputting the contact plug patterns to a photomask

According to STEP 16, the contact plug patterns 240 are outputted to a photomask, thus a photomask including a contact plug layout is obtained. And the photomask is involved in DRAM fabrication. Please refer to FIG. 7, which is schematic drawing illustrating a partial cross-sectional view of a DRAM device formed by using the photomask provided by the present invention. In some embodiments of the present invention, a substrate 300 is provided. The substrate 300 includes at least a memory cell region and a peripheral circuit region defined thereon. Next, a plurality of isolation structures 302 are formed in the memory cell region and the peripheral circuit region by using a photomask including the aforementioned active region patterns 200. Consequently, a plurality of active regions 304 for accommodating transistors are formed and electrically isolated from each other by the isolation structures 302. Next, a plurality of recesses (not shown) are formed in the memory cell by using a photomask including aforementioned buried gate patterns 210. A gate dielectric layer 306 is then formed to cover sidewalls and bottoms of the recesses and followed by forming a buried gate 310 in each recess. An insulating layer 308 is then formed to seal the recesses after forming the buried gates 310. Next, source/drain regions (not shown) are formed in the active regions 304 at two sides of the buried gates 310. It is noteworthy that the buried gates 310 are extended along the first direction D1 and arranged along the second direction D2. However, those skilled in the art would easily realize that the above mentioned elements can be formed by any other suitable processes, and thus steps for forming those elements are not limited to this. Additionally, devices required in the peripheral circuit region can be formed simultaneously with forming memory cells if in need.

Figure 7:
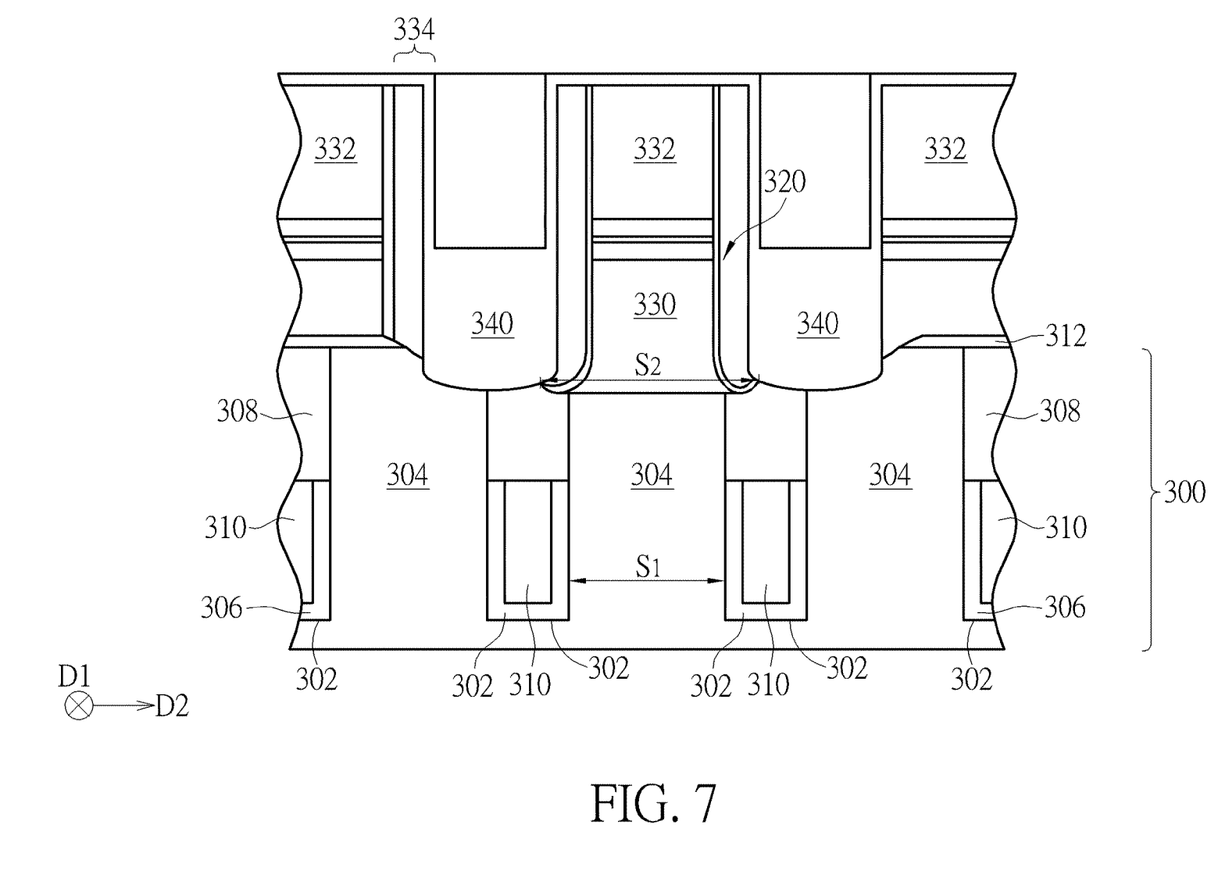
FIG. 7 is schematic drawing illustrating a partial cross-sectional view of a DRAM device formed by using a photomask provided by the present invention.

Please still refer to FIG. 7. Next, an insulating layer is formed on the substrate 300, and the contact plug layout can be transferred to the insulating layer from the photomask formed by performing STEP 18. Consequently, a patterned insulating layer 312 exposing portions of the active regions 304 is obtained. Next, an etching process is performed through the patterned insulating layer 312. Please refer to FIG. 6 together with FIG. 7. Because the length of the short sides 240S of the contact plug patterns 240 is larger than the length of the short sides 200S of the active region patterns 200, and the distance $S_2$ between the short sides 240S of each contact plug pattern 240 is larger than the distance $S_1$ between the two buried gates 310 in each active region 300, the active region 304 between the two buried gates 310 is always etched during the etching process. Accordingly, after transferring the contact plug patterns 240 from the photomask, a plurality of contact openings 320 are obtained. More important, a bottom of the contact openings 320 is always encircled by the isolation structures 302. As shown in FIG. 7, thereafter, bit line contact plugs 330, bit lines 332, spacers 334 for the bit lines 323 and the bit line contact plugs 330, and storage node contact plugs 340 are formed. More important, electrical isolation between the storage node contact plugs 340 and the bit line contact plugs 330 is constructed by the isolation structures 302 and the spacers 334. And the SC-BC short issue cause by the active regions 304 can be avoided.

Figure 8:
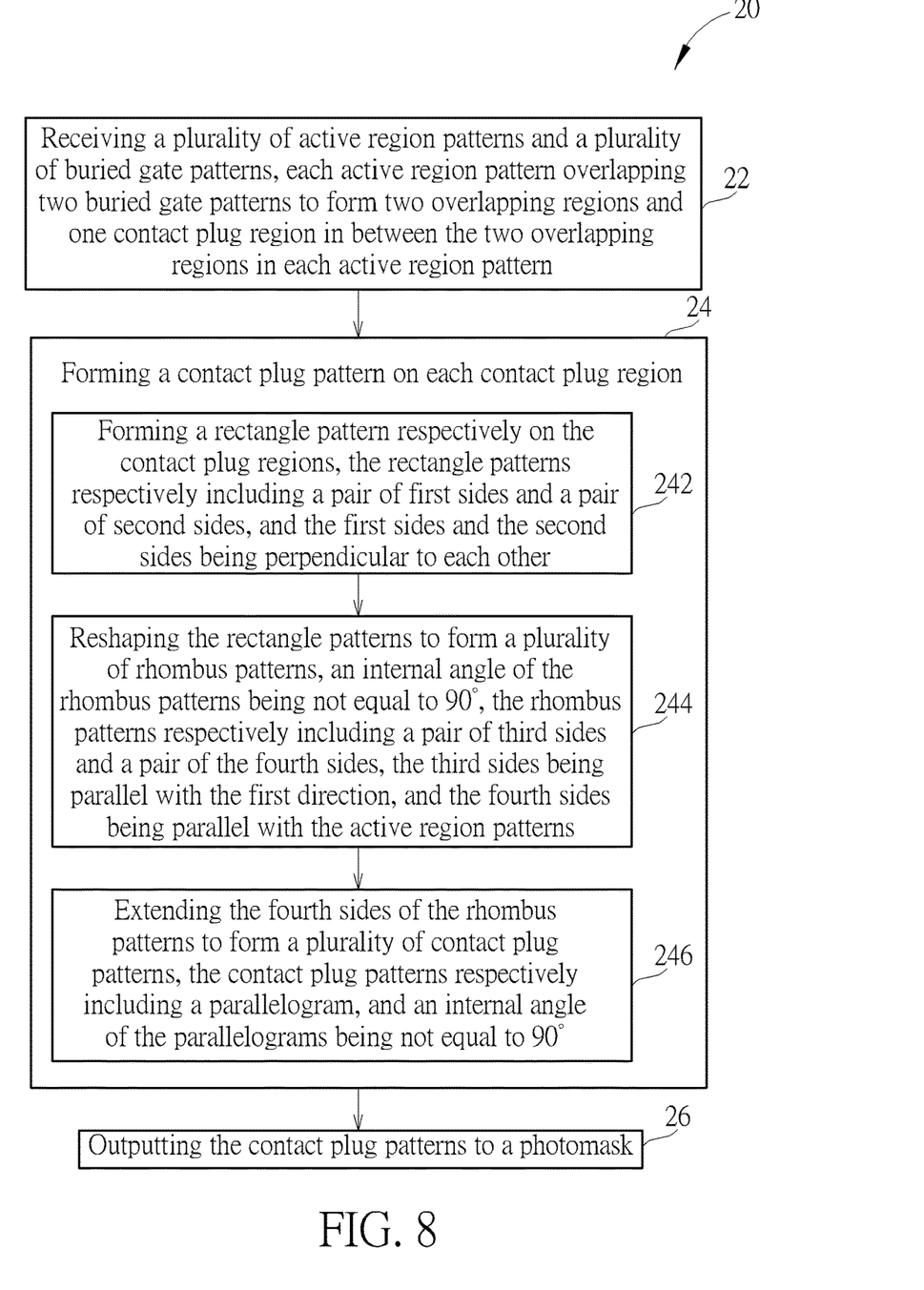
FIG. 8 is a flow chart of a method for forming a contact plug layout provided by a second preferred embodiment of the present invention.

Please refer to FIGS. 3-4 and FIGS. 8-10, wherein FIG. 8 is a flow chart of a method for forming a contact plug layout provided by a second preferred embodiment of the present invention, and FIGS. 3-4 and 9-10 are schematic drawings illustrating the method for forming the contact plug layout pattern provided by the second preferred embodiment. It should be noted that elements the same in both of the first and second preferred embodiments are designated by the same numerals. As shown in FIG. 8, the method for forming the contact plug layout pattern 20 provided by the second preferred embodiment includes:

STEP 22: Receiving a plurality of active region patterns and a plurality of buried gate patterns, each active region pattern overlapping two buried gate patterns to form two overlapping regions and one contact plug region in between the two overlapping regions in each active region pattern Please refer to FIG. 3. A plurality of active region patterns 200 and a plurality of buried gate patterns 210 are received. As mentioned above, the buried gate patterns 210 are parallel with each other, and the active region patterns 200 respectively include an island shape. As shown in FIG. 3, the active region patterns 200 respectively include a pair of long sides 200L and a pair of short sides 200S, and the short sides 200S are parallel with a first direction D1. That is, the short sides 200S of the active region patterns 200 are parallel with the buried gate patterns 210. The long sides 200L of the active region patterns 200 and the first direction D1 include an included angle $\alpha_1$, and the included angle $\alpha_1$ is not equal to 90°. Furthermore, an internal angle of the active region patterns 200 is equal to the included angle $\alpha_1$. As shown in FIG. 3, the active region patterns 200 of the preferred embodiment respectively include a parallelogram, and the internal angle of the parallelograms is not equal to 90°. The buried gate patterns 210 are extended along the first direction D1 and arranged along a second direction D2. It is noteworthy that the first direction D1 is perpendicular to the second direction D2.

Please still refer to FIG. 3. According to the preferred embodiment, each active region pattern 200 overlaps two buried gate patterns 210. Therefore, two overlapping regions 2100L are formed by the two buried gate patterns 210 and the active region pattern 200 as shown in FIG. 3. More important, a region in between the two overlapping regions 2100L is defined as a contact plug region 212 where a contact plug is to be formed. As shown in FIG. 3, any contact plug region 212 is immediately adjacent to two overlapping regions 2100L.

Please refer to FIG. 8. The method for forming the contact plug layout 20 provided by the preferred embodiment of the present invention includes:

STEP 24: Forming a contact plug pattern on each contact plug region

It is noteworthy that that STEP 24 further includes following steps in accordance with the preferred embodiment:

STEP 242: Forming a rectangle pattern respectively on the contact plug regions, the rectangle patterns respectively including a pair of first sides and a pair of second sides, and the first sides and the second sides being perpendicular to each other Please refer to FIG. 4 together with FIG. 8. According to STEP 242, an original contact plug pattern is formed on each contact plug region 212, and the original contact plug pattern includes a rectangle pattern 220, such as square pattern, but not limited to this. As shown in FIG. 4, the rectangle patterns 220 respectively include a pair of first sides 222a and a pair of second sides 222b, and a length of the first sides 222a is equal to a length of the second sides 222b. The first sides 222a are parallel with the first direction D1 and the second sides 222b are parallel with the second direction D2. In other words, the first sides 222a and the rectangle patterns 220 are parallel with the buried gate patterns 210 while the second sides 222b are perpendicular to the buried gate patterns 212. It is noteworthy that the rectangle patterns 220 overlap the contact plug regions 212 in the active region patterns 210, respectively. The length of the first sides 222a of the rectangle patterns 220 is larger than a length of the first short sides 200S of the active region patterns 200, and the length of the second sides 222b of the rectangle patterns 220 is equal to a width of the contact plug regions 212. That is, the length of the second sides 222b is equal to a distance $S_1$ between the two overlapping regions 2100L in each active region pattern 200. As shown in FIG. 4, the rectangle pattern 220 overlaps the entire contact plug region 212 in each active region pattern 200.

Figure 9:
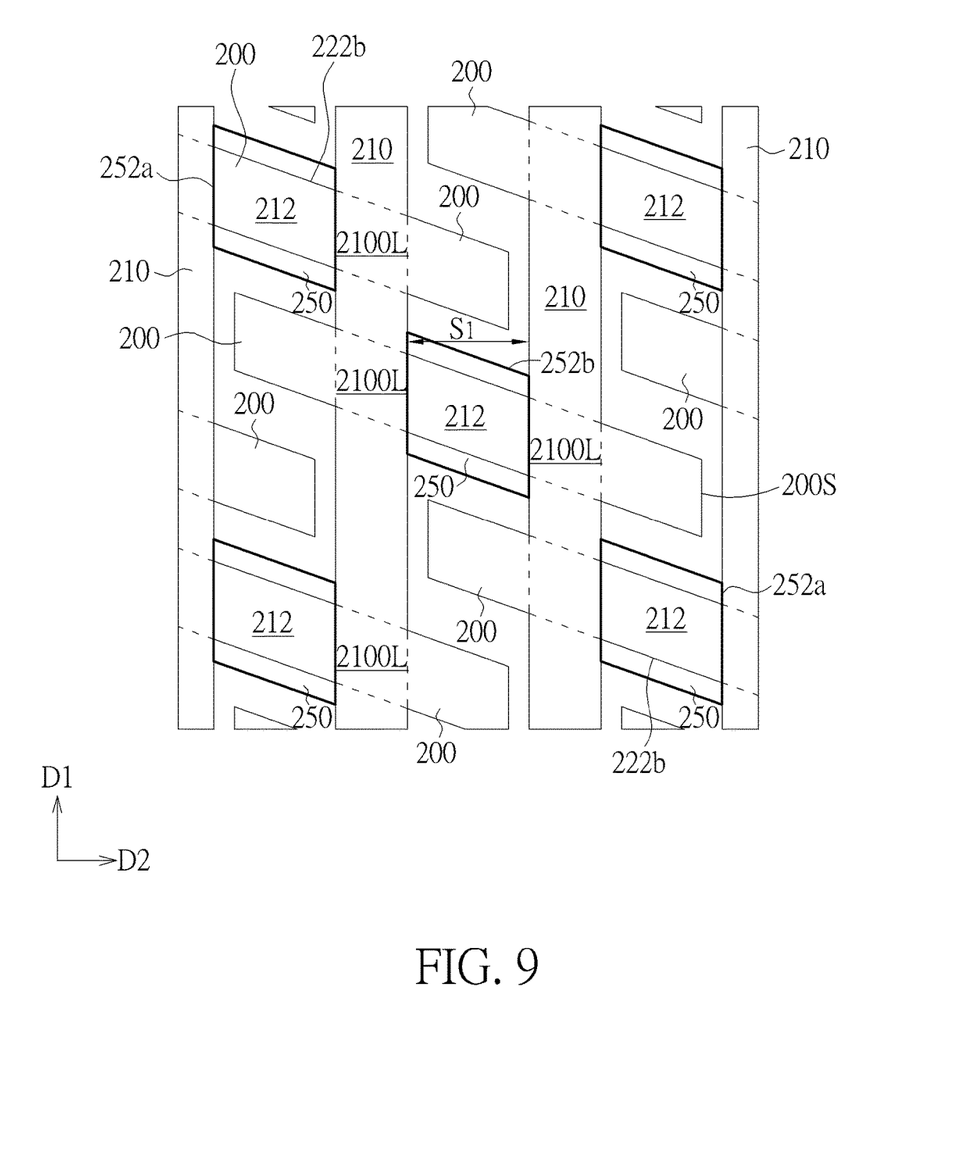
FIG. 9 is a schematic drawing in a step subsequent to FIG. 4.

Please refer to FIGS. 8 and 9. STEP 24 provided by the preferred embodiment further includes:

STEP 244: Reshaping the rectangle patterns to form a plurality of rhombus patterns, an internal angle of the rhombus patterns being not equal to 90°, the rhombus patterns respectively including a pair of third sides and a pair of fourth sides, the third sides being parallel with the first direction, and the fourth sides being parallel with the active region patterns As shown in FIG. 9. According to STEP 244 of the preferred embodiment, the rectangle patterns 220 are reshaped to form rhombus patterns 250. The rhombus patterns 250 respectively include a pair of third sides 252a and a pair of fourth sides 252b, and an included angle of the third sides 252 and the fourth sides 252b is not equal to 90°. It is noteworthy that the rhombus patterns 250 can be rotated during or after reshaping. Consequently, the third sides 252a of the rhombus patterns 250 are parallel with the first direction D1, and the fourth sides 252b are parallel with the long sides 200L of the active region patterns 200. Furthermore, a length of the third sides 252a and a length of the fourth sides 252b are equal to each other, and also equal to the length of the first sides 222a and the second sides 222b of the rectangle patterns 220. As shown in FIG. 9, the rhombus pattern 250 overlaps the entire contact plug region 212 in each active region pattern 200.

Figure 10:
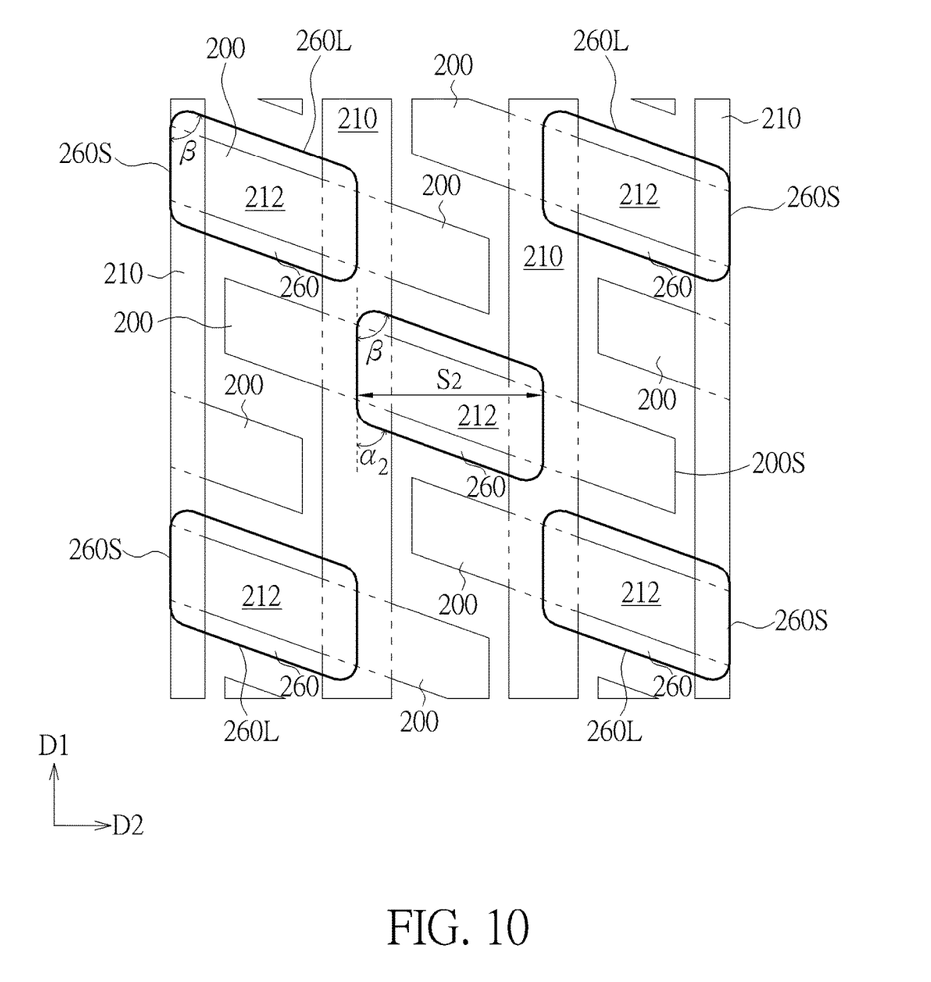
FIG. 10 is a schematic drawing in a step subsequent to FIG. 9.

Please refer to FIG. 10 together with FIG. 8. STEP 24 provided by the preferred embodiment further includes:

STEP 246: Extending the fourth sides of the rhombus patterns to form a plurality of contact plug patterns, the contact plug patterns respectively including a parallelogram, and an internal angle of the parallelograms being not equal to 90°

As shown in FIG. 10, according to STEP 246, the fourth sides 252b of the rhombus patterns 250 are extended to form a plurality of contact plug patterns 260. The contact plug patterns 260 respectively include a parallelogram, and an internal angle β of the parallelograms is not equal to 90°. The contact plug patterns 260 respectively include a pair of long sides 260L and a pair of short sides 260S, and the short sides 260S are parallel with the first direction D1. In other words, the short sides 260S are parallel with the buried gate patterns 210. As shown in FIG. 10, a length of the short sides 260S of the contact plug patterns 260 is larger than the length of the short sides 200S of the active region patterns 200. Furthermore, the long sides 260L of the contact plug patterns 260 and the first direction D1 include an included angle $\alpha_2$, and the included angle $\alpha_2$ is the same with or complementary to the included angle $\alpha_1$ formed by the first direction D1 and the long sides 200L of the active region patterns 200. As shown in FIG. 10, the long sides 260L of the contact plug patterns 260 are parallel with the long sides 200L of the active region patterns 200. It is noteworthy that a distance $S_2$ between the short sides 260S of each contact plug pattern 260 is larger than the width of the contact plug region 212. That is, the distance $S_2$ between the short sides 260S of each contact plug pattern 260 is larger the distance $S_1$ between the two overlapping regions 210OL in each active region pattern 210. Accordingly, the two buried gate patterns 210 in each active region pattern 200 are partially overlapped by the contact plug pattern 260, respectively, as shown in FIG. 10. Furthermore, a step of extending the short sides 260S of the contact plug patterns 260 is selectively performed after STEP 246. Such that the length of the short sides 260S of the contact plug patterns 260 is ensured to be larger than the length of the short sides 200S of the active region patterns 200. Accordingly, the contact plug region 212 in each active region pattern 200 is entirely overlapped by the contact plug pattern 260 including the shape the same with the contact plug region 212 and the size larger than the contact plug region 212, as shown in FIG. 10.

It is noteworthy that STEP 22 to STEP 24 can be implemented using a computer. And the method for forming the contact plug layout 20 provided by the preferred embodiment further includes following step:

STEP 26: Outputting the contact plug patterns to a photomask

According to STEP 26, the contact plug patterns 260 are outputted to a photomask, thus a photomask including a contact plug layout is obtained. And the photomask is involved in DRAM fabrication. Since those steps for forming the DRAM device is mentioned in above and depicted in FIG. 7, those details are omitted in the interest of brevity.

According to the methods for forming the contact plug layout provided by the present invention, the contact plug patterns including the shape the same with the contact plug regions and the size larger than the contact plug regions are formed. Therefore it is ensured that the following formed contact openings are larger than the active regions underneath. And thus the isolation structures used to electrically isolate the active regions are exposed at bottoms of the contact openings. Therefore, the bit line contact plugs and the storage node contact plugs that are formed thereafter can be electrically isolated by the isolation structures. In other words, process yield and product performance are both improved by the methods for forming the contact plug layout provided by the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a contact plug layout, comprising:

(a) receiving a plurality of active region patterns and a plurality of buried gate patterns, the buried gate patterns respectively extending along a first direction and arranged along a second direction perpendicular to the first direction, the active region patterns respectively extending along an extending direction different from the first direction and the second direction and overlapping adjacent two of the buried gate patterns to form two overlapping regions and one contact plug region in between the two overlapping regions in each of the active region patterns;

(b) forming a plurality of contact plug patterns respectively on the contact plug region in each of the active region patterns, the contact plug patterns respectively comprising a parallelogram having a pair of second short sides and a pair of second long sides, wherein the second short sides are parallel with the first direction and the second long sides are parallel with the extending direction of the active region patterns, wherein an included angle of the parallelograms is not equal to 90°, and the contact plug patterns respectively partially overlapping the adjacent two of the buried gate patterns and completely overlapping the contact plug region between the adjacent two of the buried gate pattern; and (c) outputting the contact plug patterns to a photomask for forming an DRAM device.

2. The method for forming the contact plug layout according to claim 1, wherein the active region patterns respectively comprise a pair of first short sides and a pair of first long sides, the first short sides are parallel with the buried gate patterns, and the first long sides are along the extending direction of the active regions.

3. The method for forming the contact plug layout according to claim 2, wherein the first direction and the extending direction of the active region patterns define an included angle that is not equal to 90°.

4. The method for forming the contact plug layout according to claim 1, wherein a distance between the second short sides of the contact plug patterns is larger than a distance between the two overlapping regions in each the active region pattern.

5. The method for forming the contact plug layout according to claim 1, wherein the step of forming the contact plug patterns respectively on the active region patterns further comprise:

forming a first rectangle pattern respectively on the contact plug regions, the first rectangle patterns respectively comprising a pair of first sides and a pair of second sides, and the first sides and the second sides being perpendicular to each other;

extending the first sides or the second sides of the first rectangle patterns to form second rectangle patterns, respectively; and reshaping the second rectangle patterns to form the contact plug patterns, and the contact plug patterns comprising the parallelograms.

6. The method for forming the contact plug layout according to claim 5, further comprising a step of extending the second short sides of the contact plug patterns after reshaping the second rectangle patterns.

7. The method for forming the contact plug layout according to claim 1, wherein the step of forming the contact plug regions respectively on the contact plug patterns further comprises:

forming a rectangle pattern respectively on the contact plug regions, the rectangle patterns respectively comprise a pair of first sides and a pair of second sides, and the first sides and the second sides being perpendicular to each other;

reshaping the rectangle patterns to form a plurality of rhombus patterns, the rhombus patterns respectively comprising a pair of third sides and a pair of the fourth sides, and the third sides being parallel with the buried gate patterns; and extending the fourth sides of the rhombus patterns to form the contact plug patterns, the contact plug patterns respectively comprising a parallelogram, and an internal angle of the parallelograms being not equal to 90°.

8. The method for forming the contact plug layout according to claim 1, wherein the contact plug patterns are transferred from the photomask to a material layer to form a plurality of contact openings.

9. A method for forming a contact plug layout, comprising:

(a) receiving a plurality of active region patterns and a plurality of buried gate patterns, the buried gate patterns respectively being extended along a first direction and arranged along a second direction perpendicular to the first direction, the active region patterns respectively extending along an extending direction different from the first direction and the second direction and overlapping adjacent two of the buried gate patterns to form two overlapping regions and one contact plug region in between the two overlapping regions in each of the active region pattern;

(b) forming a plurality of first rectangle patterns respectively on the contact plug region in each of the active region patterns, the first rectangle patterns respectively comprising a pair of first sides and a pair of second sides, and the first sides and the second sides being perpendicular to each other;

(c) extending the first sides or the second sides of each of the first rectangle patterns to form a plurality of second rectangle patterns;

(d) reshaping each of the second rectangle patterns to form a plurality of contact plug patterns, the contact plug patterns respectively comprising a parallelogram, and an internal angle of the parallelograms being not equal to 90°, the contact plug patterns respectively comprising a pair of third sides and a pair of fourth sides, the third sides being parallel with the first direction, and the fourth sides being parallel with the extending direction of the active region patterns, wherein the contact plug patterns respectively partially overlap the adjacent two of the buried gate patterns and completely overlap the contact plug region in each of the active region patterns; and (e) outputting the contact plug patterns to a photomask for forming an DRAM device.

10. The method for forming the contact plug layout according to claim 9, wherein the second sides of the first rectangle patterns are parallel with the second direction, and a length of the second sides is equal to a distance between the two overlapping regions in each active region pattern.

11. The method for forming the contact plug layout according to claim 9, wherein a distance between the third sides of each contact plug pattern is larger than a distance between the two overlapping regions in each active region pattern.

12. The method for forming the contact plug layout according to claim 9, wherein the active region patterns respectively comprise a pair of fifth sides and a pair of sixth sides, the fifth sides are parallel with the first direction, and the sixth sides and the first direction comprise an included angle.

13. The method for forming the contact plug layout according to claim 12, wherein the included angle is not equal to 90°.

14. The method for forming the contact plug layout according to claim 12, wherein a length of the first sides of the first rectangle patterns is larger than a length of the fifth sides of the active region patterns.

15. The method for forming the contact plug layout according to claim 12, wherein a length of the third sides of the contact plug patterns is larger than a length of the fifth sides of the active region patterns.

16. The method for forming the contact plug layout according to claim 12, wherein the fourth sides of the contact plug patterns are parallel with the sixth sides of the active region patterns.

17. The method for forming the contact plug layout according to claim 9, further comprising a step of extending the third sides of the contact plug patterns after forming the contact plug patterns.

18. The method for forming the contact plug layout according to claim 9,
wherein the contact plug patterns are transferred from the photomask to a material layer to form a plurality of contact openings.

19. A method for forming a contact plug layout, comprising:
(a) receiving a plurality of active region patterns and a plurality of buried gate patterns, the buried gate patterns being extended along a first direction and arranged along a second direction perpendicular to the first direction, the active region patterns being extending along an extending direction different from the first direction and the second direction and respectively overlapping adjacent two of the buried gate patterns to form two overlapping regions and one contact plug region in between the two overlapping regions in each of the active region patterns;
(b) forming a plurality of rectangle patterns respectively on the contact plug region in each of the active region patterns, the rectangle patterns respectively comprise a pair of first sides and a pair of second sides, and the first sides and the second sides being perpendicular to each other;
(c) reshaping the rectangle patterns to form a plurality of rhombus patterns, an internal angle of the rhombus patterns being not equal to 90°, the rhombus patterns respectively comprising a pair of third sides and a pair of the fourth sides, the third sides being parallel with the first direction, and the fourth sides being parallel with the extending direction of the active region patterns;
(d) extending the fourth sides of each of the rhombus patterns to form a plurality of contact plug patterns, the contact plug patterns respectively comprising a parallelogram, and an internal angle of the parallelograms being not equal to 90°, wherein the contact plug patterns respectively partially overlap the adjacent two of the buried gate patterns and completely overlap the contact plug region in each of the active region patterns; and
(e) outputting the contact plug patterns to a photomask to define an etched region of an active region of an DRAM device.

\* \* \* \* \*